US012600619B2

(12) United States Patent
 Partanen

(10) Patent No.: US 12,600,619 B2
(45) Date of Patent: Apr. 14, 2026

(54) EARLY-IMPACT OUT-OF-PLANE MOTION LIMITER FOR MEMS DEVICE

(71) Applicant: Murata Manufacturing Co., Ltd., Nagaokakyo (JP)

(72) Inventor: Mikko Partanen, Vantaa (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 588 days.

(21) Appl. No.: 18/151,962

(22) Filed: Jan. 9, 2023

(65) Prior Publication Data
 US 2023/0219803 A1 Jul. 13, 2023

(30) Foreign Application Priority Data
 Jan. 10, 2022 (FI) ...................................... 20225013

(51) Int. Cl.
 B81B 3/00 (2006.01)
(52) U.S. Cl.
 CPC ..... B81B 3/0021 (2013.01); B81B 2203/0118 (2013.01); B81B 2203/0307 (2013.01)
(58) Field of Classification Search
 CPC ............... B81B 7/0016; B81B 3/0021; B81B 2203/0307; B81B 2203/0154; B81B 3/0051
 See application file for complete search history.

(56) References Cited

U.S. PATENT DOCUMENTS

| | | | | |
|---|---|---|---|---|
| 9,061,895 B2 * | 6/2015 | Robert | .................. | B81B 3/0051 |
| 2002/0149071 A1 * | 10/2002 | Shim | ..................... | B81B 3/0013 |
| | | | | 257/415 |
| 2004/0061962 A1 * | 4/2004 | Kwon | ................... | B81B 7/0016 |
| | | | | 359/876 |
| 2012/0216616 A1 * | 8/2012 | Schultz | ................. | G01P 15/125 |
| | | | | 73/514.01 |
| 2022/0120781 A1 | 4/2022 | Reinmuth | | |

FOREIGN PATENT DOCUMENTS

EP 3306268 A1 4/2018

OTHER PUBLICATIONS

Seren, et al., "Lamellar-Grating-Based MEMS Fourier Transform Spectrometer," in Journal of Microelectromechanical Systems, 2012, vol. 21, No. 2, pp. 331-339.62.

* cited by examiner

*Primary Examiner* — Moazzam Hossain
(74) *Attorney, Agent, or Firm* — ArentFox Schiff LLP

(57) ABSTRACT

A microelectromechanical device having a mobile rotor and a fixed stator in a device plane, and a motion limiter that prevents the mobile rotor from contacting a fixed wall in a vertical direction that is perpendicular to the device plane. Moreover, the motion limiter extends between the rotor and the stator and includes a stopper lever that is configured to rotate out of the device plane.

19 Claims, 4 Drawing Sheets

EARLY-IMPACT OUT-OF-PLANE MOTION LIMITER FOR MEMS DEVICE

CROSS REFERENCE TO RELATED APPLICATIONS

This application claims priority to Finnish Patent Application No. 20225013, filed Jan. 10, 2022, the entire contents of which are hereby incorporated by reference in its entirety.

TECHNICAL FIELD

This disclosure relates to microelectromechanical (MEMS) devices, and particularly to motion limiters that prevent undesired contact between mobile and stationary device parts.

BACKGROUND

Microelectromechanical (MEMS) devices such as accelerometers and gyroscopes often comprise a mass element that is suspended from fixed anchors with a flexible suspension structure which allows the mass element to move in relation to adjacent fixed structures. The mobile mass element may be called a rotor and a fixed device part where the anchors are located may be called a stator. The fixed structures adjacent to the rotor also usually include walls which form an enclosure around the rotor and other active parts of the MEMS device.

Direct physical contact between the rotor and fixed structures is usually not desirable because it may disturb the operation of the device. Although the rotor and its suspension structure can be dimensioned so that direct contact does not occur in regular operation, exceptional external shocks may still displace the rotor so much that it comes into direct contact with fixed structures, causing structural damage, stiction, electrical short-circuits or other faults.

Motion limiters can be implemented in MEMS devices to reduce or prevent these harmful consequences. A motion limiter may for example comprise a bump which is attached to the rotor and extends from the rotor towards an adjacent fixed structure. The gap between the motion limiter bump and the fixed structure may be narrow in the expected direction of motion, so that the bump will be the first part which comes into contact with the fixed structure in the event of an external shock. Damage can be reduced for example by placing a motion limiter bump as far away from the most sensitive areas of the rotor as possible.

However, the space that is available for motion limiters is usually limited by cost and design considerations. Furthermore, a general problem with a motion limiter bump rigidly fixed to a rotor is that the bump and the rotor always move together. If the impact between the bump and the fixed structure is hard, particles can be released particles from the fixed structure or from the bump itself. These particles can move toward the more sensitive regions of the device, limit the dynamical operation range and cause short-circuiting or other damage.

SUMMARY OF THE INVENTION

Accordingly, it is an object of the present disclosure to provide apparatus that alleviates the problems mentioned above. The object of the disclosure is achieved by an arrangement that As described in this, the exemplary embodiments are based on the idea of building a motion limiter that is connected to a rotor and set in motion by the out-of-plane movement of the rotor. The motion limiter moves toward the fixed structure faster than the rotor, so that it can make contact at an early stage of the movement when the rotor has not yet gained substantial momentum. One advantage of this arrangement is that the impact between the motion limiter and the fixed structure will be softer.

BRIEF DESCRIPTION OF THE DRAWINGS

In the following the disclosure will be described in greater detail by means of preferred embodiments with reference to the accompanying drawings, in which FIGS. 1a-1c illustrate a first device part, a second device part and a motion limiter which extends between the first device part and the second device part.

DETAILED DESCRIPTION OF THE DISCLOSURE

Figure 2A:
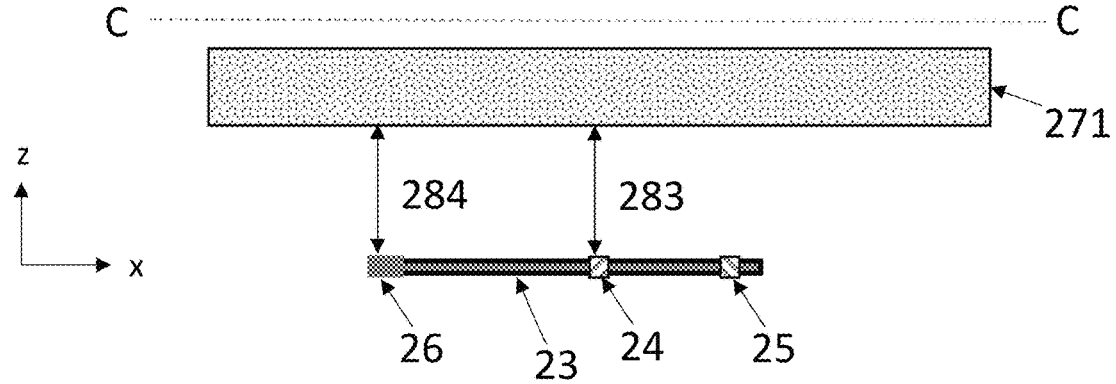
FIGS. 2a-2e illustrate the operation of the motion limiter when the first device part is the rotor.

A rotor in a MEMS device is typically formed in a device layer, for example by etching the device layer. The device layer may, for example, be a silicon wafer. Alternatively, it may be a layer of silicon which has been deposited on a substrate. The rotor is partially released from surrounding fixed structures when the device is manufactured. It may for example be suspended by flexible suspenders from fixed anchor points. The suspenders may be formed in the same etching process as the rotor, and the regions of the fixed structure where the anchor points are located may be regions of the device layer which are adjacent to the rotor.

A stator that is adjacent to the rotor in a MEMS device may be any part of the device layer which (unlike the rotor) remains fixed to a given position with respect to surrounding fixed structures regardless of the movement experienced by the device. The stator may be used as a fixed reference point in a measurement which tracks the movement of the rotor, for example, in a capacitive measurement arrangement where a set of electrodes is prepared on the stator and a set of adjacent counter-electrodes is prepared on the rotor. A piezoelectric measurement arrangement may alternatively be prepared on a flexible suspender which extends from the stator to the rotor. However, the fixed stator which is used for the purpose of building the motion limiter described in this disclosure does not necessarily have to be the same structure which is used for measuring the movement of the rotor. Two separate stator structures could instead by used for these two purposes.

The device layer defines a device plane, which is illustrated as the xy-plane in this disclosure. The device plane may also be referred to as the horizontal plane. A direction which is perpendicular to the device plane is in this disclosure illustrated with a z-axis, and it may be called the vertical direction or the out-of-plane direction. The words "horizontal" and "vertical" refer in this disclosure only to a plane and to a direction which is perpendicular to that plane. They do not imply anything about how the device should be oriented with respect to the earth's gravitational field when the device is manufactured or used. The same also applies to terms which are related to "vertical", such as "above" and "below", "high" and "low", "up" and "down".

In some technical applications, the rotor may be designed to undergo linear out-of-plane motion where the entire rotor moves out of the device plane. In other applications, the rotor may be designed to undergo rotational out-of-plane motion where it rotates about an axis which lies in the device plane. This disclosure presents motion limiters intended for limiting out-of-plane motion of any kind.

According to an exemplary aspect, a microelectrome-chanical device is provided comprising a mobile rotor that lies in a horizontal device plane in its rest position, and a fixed stator that lies in the horizontal device plane adjacent to the mobile rotor. The device further comprises a fixed wall which defines a wall plane which is adjacent to the hori-zontal device plane, wherein the fixed wall is separated from the mobile rotor in a vertical direction by a rotor-wall gap, wherein the vertical direction is perpendicular to the hori-zontal device plane.

The device further comprises a motion limiter and a counter-structure. The motion limiter comprises a stopper element. The counter-structure is adjacent to the horizontal device plane and separated from the horizontal device plane in a vertical direction. The stopper element and the counter-structure are separated by a vertical stopper gap when the mobile rotor is in the horizontal device plane. When the mobile rotor undergoes motion in the vertical direction toward the fixed wall, the device brings the stopper element into contact with the counter-structure across the stopper gap before the mobile rotor comes into contact with the fixed wall across the rotor-wall gap.

Either the mobile rotor is a first device part and the fixed stator is a second device part, or the mobile rotor is a second device part and the fixed stator is a first device part accord-ing to various exemplary aspects.

An edge of the first device part is separated from an edge of the second device part in the horizontal device plane by a rotor-stator gap that extends in a transversal direction. The motion limiter extends from the first device part to the second device part across the rotor-stator gap, and the motion limiter comprises a torsionally flexible first attach-ment section which is attached to the edge of the first device part and extends in the transversal direction toward the second device part. The motion limiter also comprises a stopper lever which is attached to the attachment section.

A first side of said stopper lever extends in a first side direction from the attachment section. A second side of said stopper lever extends in a second side direction from the attachment section. The second side direction is opposite to the first side direction. The stopper lever comprises the stopper element on its second side. The motion limiter further comprises a torsionally flexible connecting section which extends from the edge of the second device part to the first side of said stopper lever.

The mobile rotor may in some applications be called a mass element, a proof mass or a Coriolis mass. The rotor is in its rest position when it is not undergoing movement with respect to the fixed structures. In operation, the rotor may be moved away from its rest position, and, for example, driven into oscillating movement, by a force transducer. In addition to (or alternatively to) this deliberate actuation, the rotor may be moved away from its rest position by external forces which act on the MEMS device. The motion limiter described in this disclosure may be configured to limit out-of-plane motion of any kind.

The device part that is referred to as the "first device part" may be either the mobile rotor or the fixed stator. The device part that is referred to as the "second device part" is the other one of these two parts. Depending on which of these options applies, the counter-structure may either be (a) the fixed wall itself or a structure which is attached to the fixed wall or (b)

a structure which lies on opposite sides of the device plane compared to the fixed wall. These options will be explained in more detail below, with reference to the figures.

Figures 1A, 1B, 1C:
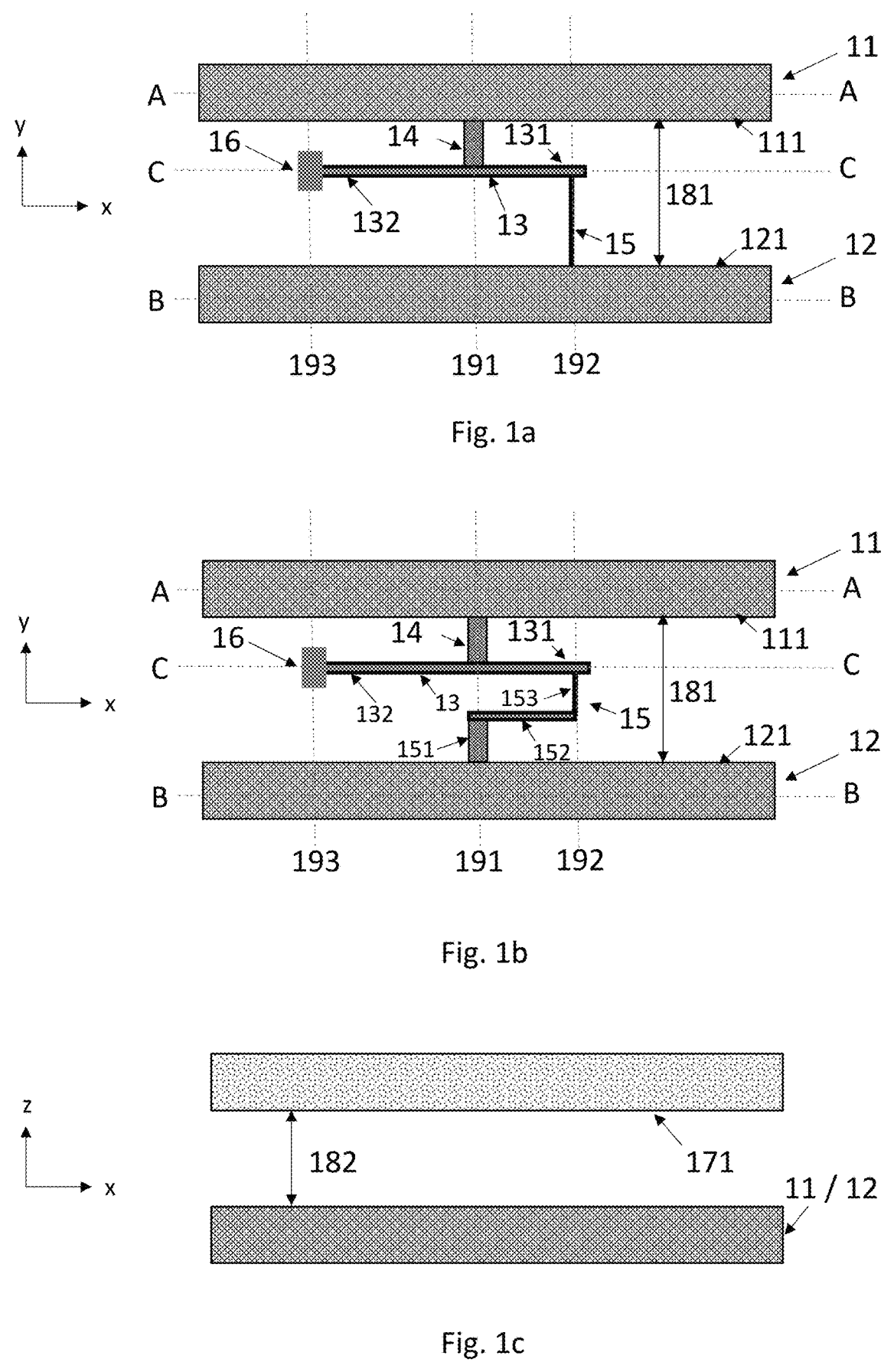

FIG. 1a illustrates the first device part 11 and the second device part 12. The transversal direction is here the y-direc-tion. As shown, the edge 111 of the first device part 11 is separated from the edge 121 of the second device part by a rotor-stator gap 181. The motion limiter is the structure which extends across this gap in FIG. 1a.

The motion limiter comprises the attachment section 14 that is torsionally flexible. In other words, the attachment section 14 may be twisted about its transversal lengthwise axis 191, which may also be called the first transversal axis. The motion limiter also comprises the stopper lever 13 which is attached to the attachment section 14. The stopper lever has a first side 131 and a second side 132.

For purposes of this disclosure, the term "lever" refers to any structure that is configured to be attached to the attach-ment section so that it can rotate out of the device plane when the attachment section is twisted. Levers may have an elongated shape, as the figures of this disclosure illustrate. However, many other shapes are also possible in alternative aspects. Moreover, a lever may be stiff in the out-of-plane direction, at least in comparison to torsionally flexible parts, so that most of the deformation in the motion limiter occurs primarily in the torsionally flexible parts. However, a lever may alternatively have some degree of out-of-plane flex-ibility.

A lateral direction in the horizontal device plane is perpendicular to the transversal direction. The lateral direc-tion is illustrated as the x-direction in FIG. 1a. The stopper lever 13 extends in the lateral direction in FIG. 1a, but it could alternatively extend in any other direction in the xy-plane as long as it can undergo out-of-plane rotation about the attachment section 14.

FIG. 1a also illustrates the connecting section 15. The connecting section is also torsionally flexible about the axis 192, which may be called the second transversal axis. Consequently, when the first and the second device parts 11 and 12 undergo relative vertical movement (e.g., when one of them moves upward or downward), the attachment sec-tion 14 and the connecting section 15 will flexibly accom-modate this movement by twisting. This twisting allows the stopper lever 13 to rotate about the first transversal axis 191, so that the two sides of the stopper lever move in opposite vertical directions. This movement will be illustrated and explained in more detail below. The attachment section 14 and the connecting section 15 may for example be imple-mented as torsion bars. Torsion bars are structure with length/width/height aspect ratios that facilitate torsional twisting. The attachment section and the connecting section may alternatively be implemented with other kinds of tor-sionally flexible elements, for example meandering springs.

As further shown, the motion limiter also comprises a stopper element 16 on the stopper lever. The stopper element may, for example, be simply the end of the stopper lever, but it could alternatively be a stopper bump which protrudes from the stopper lever in the x-y plane (as illustrated) and/or in the z-direction (illustrated in FIG. 2e below). The stopper element may be located at the end of the stopper lever (as illustrated), but it could alternatively be located somewhere else on the second side 132 of the stopper lever if it is a bump which protrudes from the stopper lever in the z-di-rection. As mentioned above, the stopper element should be the first part of the motion limiter that comes into contact with the counter-structure when the rotor is displaced suf-ficiently far in the vertical direction.

The first attachment section 14 may be aligned on a first transversal axis 191, the stopper element 16 may be aligned on a third transversal axis 193, and the attachment point of the connecting section 15 on the first side 131 of the stopper lever 13 may be aligned on a second transversal axis 192. According to an exemplary aspect, the lateral distance from the first transversal axis 191 to the second transversal axis 192 may be less than the lateral distance from the first transversal axis 191 to the third transversal axis 193.

The connecting section 15 may extend in the transversal direction from the edge 121 of the second device part 12 to the first side 131 of the stopper lever 13, as FIG. 1a illustrates. The connecting section 15 is in this case simply a torsionally flexible, transversally oriented torsion bar.

FIG. 1b illustrates an alternative device where the connecting section 15 comprises a torsionally flexible second attachment section 151 that is attached to the edge 121 of the second device part 12. The second attachment section 151 extends in the transversal direction toward the first device part 11. The connecting section 15 further comprises a torsionally flexible third attachment section 153 which is attached to the attachment point on the first side 131 of the stopper lever 13. The connecting section 15 further comprises a connecting lever 152 which extends from the second attachment section 151 to the third attachment section 153. The second attachment section 151 may be, but does not have to be, aligned on the first transversal axis 191.

FIG. 1c illustrates the fixed wall 171 that lies above the device plane. The first or second device part which is the rotor (11/12) is in its rest position, and it is separated from the fixed wall 171 by the rotor-wall gap 182. The fixed wall may, for example, be a surface on a support wafer which is adjacent to the device layer and provides mechanical support for the device layer on one or more edges (not illustrated) of the device. Alternatively, the fixed wall may be a surface on a cap wafer that has been placed adjacent to the device layer, or an inside surface of a packaging structure.

The fixed walls that are adjacent to the device layer typically form an enclosure around the rotor. To prevent direct contact between the rotor 11/12 and any vertically adjacent fixed wall 171 when the out-of-plane displacement of the rotor 11/12 approaches a given threshold value (which may be close to the vertical rotor-wall gap), the motion limiter which is designed to bring the stopper element 16 into contact with the counter-structure before the rotor 11/12 can make contact with the fixed wall.

The motion limiter is built in the gap between the rotor (11/12) and the fixed stator (12/11). The fixed stator is in the horizontal device plane. The fixed stator may be any fixed structure which lies adjacent to the rotor. If the device layer is formed in a device wafer, the fixed stator may be a fixed part of this wafer. The flexible suspension structure that supports the weight of the mobile rotor may extend between the fixed stator and the mobile rotor. However, the suspension structure could alternatively be attached to some other fixed structure than the fixed stator where the motion limiter is attached.

As mentioned above, the device part which is referred to as the "first device part" may be either the mobile rotor or the fixed stator. These two cases will now be discussed in detail with reference to the figures.

Exemplary Embodiment Where the First Device Part is the Mobile Rotor

In this embodiment the first device part is the mobile rotor, the second device part is the fixed stator, and the fixed wall and the counter-structure are on the same side of the device plane. The second end of the stopper lever will in this case move in the same direction as the mobile rotor.

Figure 2B:
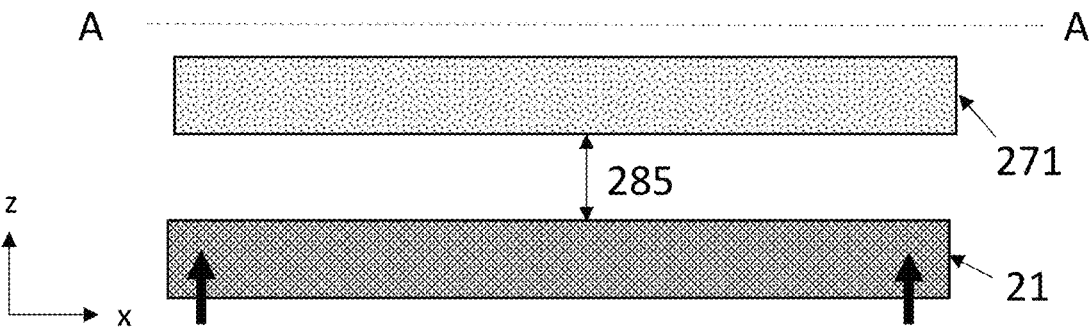
Figure 2C:
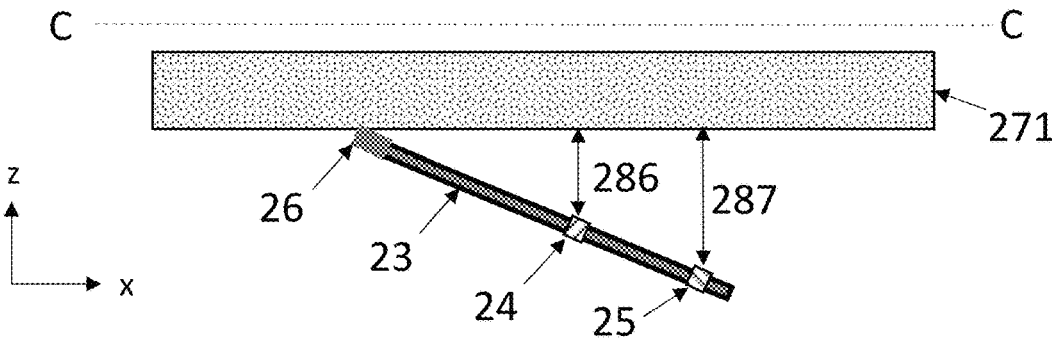

FIGS. 2a-2c show cross-sections along the lines C-C and A-A in FIGS. 1a and 1b when the first device part is the mobile rotor. Reference numbers 21, 23, 24, 25, 26 and 271 correspond to reference numbers 11, 13, 14, 15, 16 and 171, respectively, in FIGS. 1a-1c.

FIG. 2a shows the position of the stopper lever 23 when the rotor is in its rest position in the xy-plane. The first attachment section 24 is separated from the fixed wall 271 by a vertical first separation gap 283 and the stopper element 26 is separated from the fixed wall 271 by the stopper gap 284.

The fixed wall 271 is here used as the counter-structure in the motion-limiter illustrated in FIGS. 2a-2c. The stopper element 26 is at the very end of the stopper lever 23 and has the same vertical height as the stopper lever 23. Furthermore, since the stopper lever 23 is level in the xy-plane when the rotor is in its rest position, the vertical heights of the first separation gap 283 and the stopper gap 284 are in this case equal to the vertical height of the rotor-wall gap 182 in FIG. 1c.

The operation of the motion limiter is illustrated in FIGS. 2b and 2c. FIG. 2b shows the A-A cross section from FIGS. 1a-1b when the mobile rotor 21 has moved toward the fixed wall 271 so that the vertical height of a second separation gap 285 between the rotor 21 and the wall 271 is less than the vertical height of the rotor-wall gap 182 in FIG. 1c.

The first attachment section 24 is rigidly attached to the mobile rotor 21 and moves upward with the rotor. FIG. 2c shows the C-C cross section in FIGS. 1a-1b when the mobile rotor 21 is in the position illustrated in FIG. 2b. The vertical height of a third separation gap 286 between the first attachment section 24 and the fixed wall 271 is equal to the vertical height of the second separation gap 285 in FIG. 2b.

However, the connecting section 25 remains attached to the fixed stator, which remains in the xy-plane. If the connecting section 25 is very stiff in the vertical direction, the vertical height of a fourth separation gap 287 can still be the same as the rotor-wall gap 182 in FIG. 1c. The movement of the rotor creates a torque that rotates the stopper lever about the first transversal axis 191. In the illustrated case, the flexible deformation that is needed in the motion limiter to accommodate the out-of-plane movement of the mobile rotor 21 is torsional deformation in 24 and 25.

Alternatively, the connecting section could have a little bit of vertical flexibility, but still be stiff enough to pull the first end of the stopper lever 23 below the rotor 21 when the rotor moves upward, so that the fourth separation gap 287 obtains a value which is between 182 and 286 when the rotor has moved upward. In this case, the torque that turns the stopper lever will be smaller than if the connecting section is vertically stiff, but the stopper lever 23 will nevertheless rotate so that the stopper element 26 moves to a higher z-coordinate than the rotor 21. In this case, the flexible deformation may be a combination of torsional deformation in 24 and 25 and vertical bending in 25.

In FIG. 2c, the turning of the stopper lever 23 has brought the stopper element 26 into contact with the fixed wall 271. The motion limiter thereby rigidly resists further upward movement in the mobile rotor 21. If the stopper lever 23 has some vertical flexibility, it may bend a little and the resistance may have a degree of elasticity.

The stopper lever 23, the stopper element 26 and the stopper gap 284 should be dimensioned so that the stopper element 26 is brought into contact with the counter-structure 271 across the stopper gap 284 before the mobile rotor 21 comes into direct physical contact with the fixed wall 371 across the rotor-wall gap.

In the case illustrated in FIGS. 2a-2c, the stopper element 26 will make early contact with the fixed wall due to the fact that the lateral distance from the first transversal axis to the second transversal axis is less than the lateral distance from the first transversal axis to the third transversal axis. In other words, the distance in the x-direction between 24 and 25 in FIG. 2a is less than the distance between 26 and 24. The velocity at which the stopper element 26 moves toward the fixed wall 271 will be greater than the velocity at which the mobile rotor 21 moves toward the fixed wall 271, but the motion limiter begins to counteract the movement of the rotor early, before the rotor can gain substantial momentum in the vertical direction. This configuration reduces the possibility of damage when the stopper element strikes the fixed wall 271.

Figure 2D:
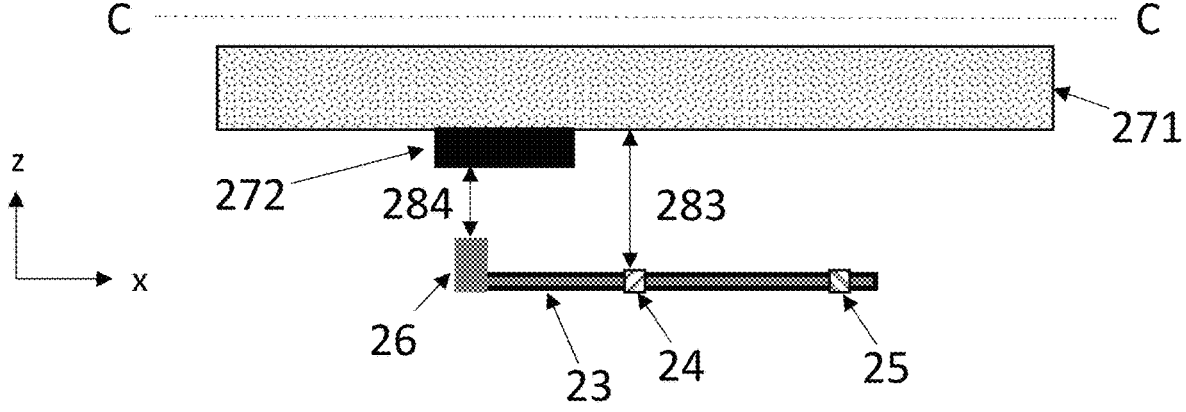

FIG. 2d illustrates an alternative option where a separate counter-structure 272 is used. The counter-structure 272 is a protrusion which extends from the fixed wall toward the stopper element 26. Additionally, the stopper element 26 here extends in the vertical direction from the stopper lever 23 toward the fixed wall 271. If either of these two alternatives apply (i.e., counter-structure extends toward stopper element from the fixed wall, or stopper element extends toward the counter-structure or the fixed wall) then the vertical height of the stopper gap 284 may be less than the vertical height of the rotor-wall gap when the rotor is in its rest position.

Figure 2E:
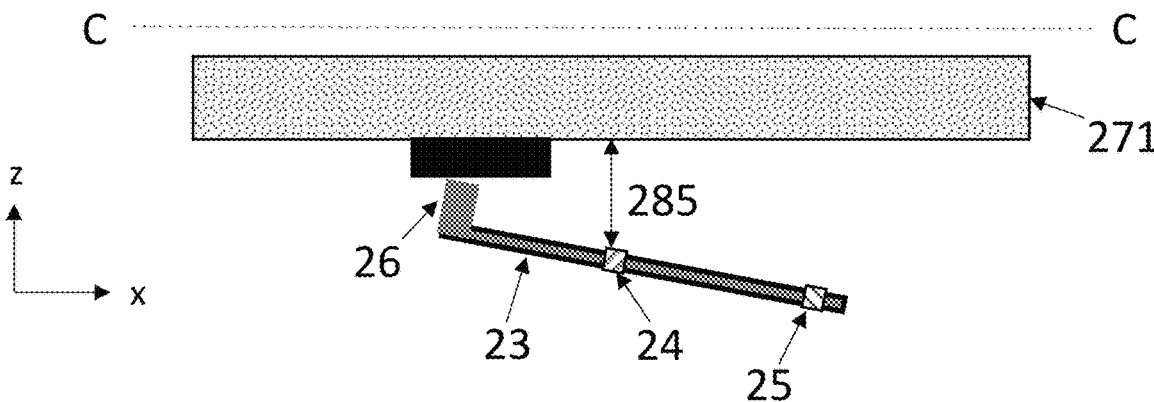

The early-impact operating principle of the motion limiter can be achieved with the device shown in FIG. 2d even when the lateral distance from the first transversal axis to the second transversal axis is greater than the lateral distance from the first transversal axis to the third transversal axis. This is illustrated in FIG. 2e. The relative movement of the rotor lever 23 in relation to the mobile rotor is slower (i.e., the rotation angle is smaller) than in FIG. 2c, but the stopper element 26 can nevertheless make contact with the counter-structure at an early stage of the movement. By dimensioning the stopper lever 23, the stopper element 26 and/or the counter-structure 272 suitably, the motion limiter can be arranged to limit the movement of the mobile rotor before it has gained significant momentum.

Exemplary Embodiment Where the Second Device Part is the Mobile Rotor

In this embodiment, the second device part is the mobile rotor, the first device part is the fixed stator, and the fixed wall and the counter-structure are on opposite sides of the device plane. The second end of the stopper lever will in this case move in a direction which is opposite to the direction in which the mobile rotor moves.

Figure 3A:
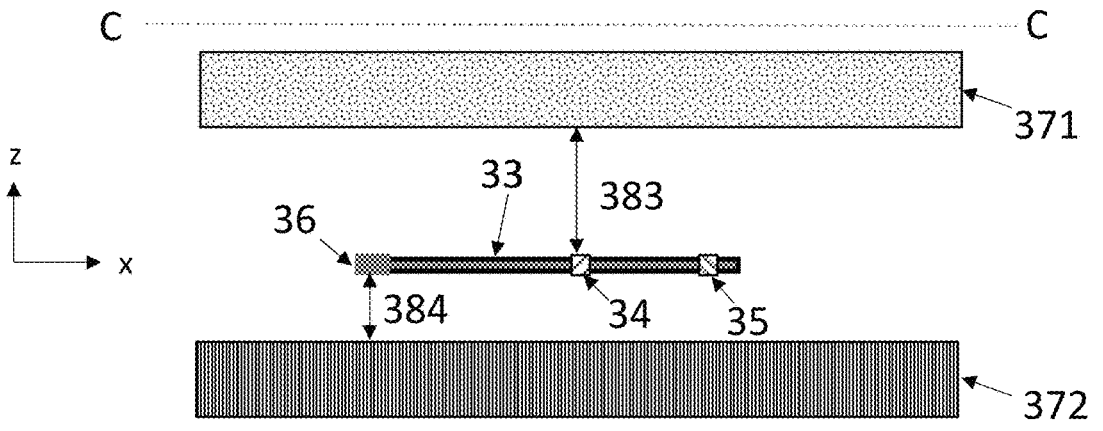
FIG. 3a-3c illustrate the operation of the motion limiter when the second device part is the rotor.
Figure 3B:
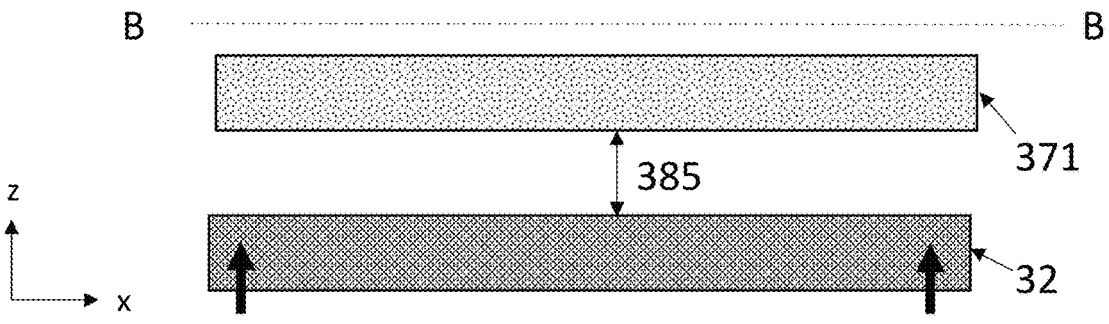
Figure 3C:
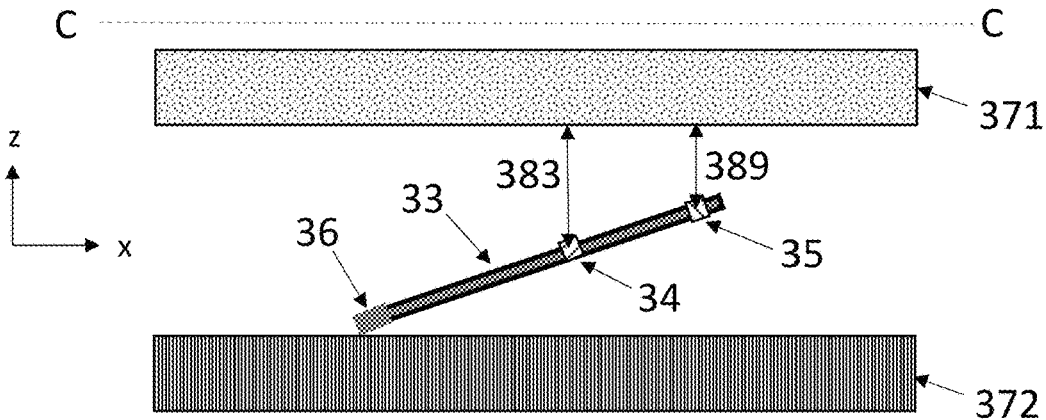

FIGS. 3a-3c show cross-sections along the lines C-C and B-B in FIGS. 1a and 1b when the first device part is the mobile rotor. Reference numbers 32, 33, 34, 35, 36 and 371 correspond to reference numbers 12, 13, 14, 15, 16 and 171, respectively, in FIGS. 1a-1c.

FIG. 3a shows the position of the stopper lever 33 when the rotor is in its rest position in the xy-plane. As in the previous embodiment, the first attachment section 34 is separated from the fixed wall 371 by a vertical first separation gap 383. Unlike in the previous embodiment, the counter-structure 372 is in this case located below the stopper element 36. The stopper element is separated from the counter-structure 372 by the stopper gap 384.

The counter-structure 372 may, for example, be a fixed wall that lies below the rotor and the motion limiter, but it could alternatively be any smaller fixed structure located below the motion limiter. When the rotor 32 is in its rest position, the vertical height of the first separation gap 383 is equal to the vertical height of the rotor-wall gap 182 in FIG. 1c. The vertical height of the stopper gap 384, on the other hand, could be given any suitable value.

The operation of the motion limiter is illustrated in FIGS. 3b and 3c. FIG. 3b shows the B-B cross section from FIGS. 1a-1b when the mobile rotor 32 has moved toward the fixed wall 371 so that the vertical height of a second separation gap 385 between the rotor 32 and the wall 371 is less than the vertical height of the rotor-wall gap 182 in FIG. 1c.

The first attachment section 34 is rigidly attached to the fixed stator (the stator is not illustrated in FIGS. 3a-3c), so it must remain level in the xy-plane when the rotor 32 moves. FIG. 3c shows the C-C cross section from FIGS. 1a-1b when the mobile rotor 32 is in the position illustrated in FIG. 3b. The vertical height of the third separation gap 383 between the first attachment section 34 and the fixed wall 371 remains unchanged.

Moreover, the connecting section 35, on the other hand, has now moved upward with the mobile rotor 32. The first side of the stopper lever 33 has therefore also moved upward, and this movement has shifted the second side of the stopper lever 33 downward, as FIG. 3c illustrates. If the connecting section 35 is very stiff in the vertical direction, the vertical height of a third separation gap 389 may be the same as the second separation gap 385 in FIG. 3b. The movement of the rotor 32 creates a torque which rotates the stopper lever 33 about the first transversal axis 191. In the illustrated case, the flexible deformation which is needed in the motion limiter to accommodate the out-of-plane movement of the mobile rotor 32 is torsional deformation in 34 and 35.

As in the previous embodiment, the connecting section 35 could have some vertical flexibility, but still be stiff enough to lift the first end of the stopper lever 33 above the device plane when the rotor 32 moves upward, so that the third separation gap 389 obtains a value which is between 383 and 385 when the rotor 32 has moved upward. In this case the torque which turns the stopper lever 33 will be smaller than if the connecting section is vertically stiff, but the stopper lever 33 will nevertheless rotate so that the stopper element 36 moves to a lower z-coordinate than the stator. In this case, the flexible deformation may be a combination of torsional deformation in 34 and 35 and vertical bending in 35.

In FIG. 3c the turning of the stopper lever 33 has brought the stopper element 36 into contact with the counter-structure 372. Since the stopper lever 33 will not rotate any further, the motion limiter now rigidly resists further upward movement in the mobile rotor 32. If the stopper lever 33 has some vertical flexibility, it may bend a little and the resistance may have a degree of elasticity.

According to exemplary aspects, the stopper lever 33, the stopper element 36 and the stopper gap 384 should be dimensioned so that the stopper element 36 is brought into contact with the counter-structure 372 across the stopper gap 384 before the mobile rotor 32 comes into direct physical contact with the fixed wall 371 across the rotor-wall gap.

As in the previous embodiment, the lateral distance from the first transversal axis to the second transversal axis may be less than the lateral distance from the first transversal axis to the third transversal axis. This is illustrated in FIG. 3a, where the distance in the x-direction between 34 and 35 is less than the distance between 36 and 34. The velocity at which the stopper element 36 moves toward the counter-structure 372 will in this case be greater than the velocity at which the mobile rotor 32 moves toward the fixed wall 371. The motion limiter begins to counteract the movement of the rotor early, before the rotor can gain substantial momentum in the vertical direction. This may reduce the possibility of damage when the stopper element 36 strikes the counter-structure 372.

However, the stopper element can be configured to make early contact with counter-structure even if the distance relationships discussed above do not apply. This will depend on the magnitude of the stopper gap 384. If necessary, the stopper element 36 could extend downward from the stopper lever 33 toward the counter-structure 372, so that the stopper gap 384 is reduced. Alternatively, the counter-structure 372 could be brought closer to the stopper gap by other means, for example by building a protrusion below the stopper element 36. By dimensioning the stopper gap 384 suitably, the motion limiter can be arranged to limit the movement of the mobile rotor 32 before it has gained significant momentum.

Linear and Rotational Rotor Movement

The mobile rotor may undergo linear out-ot-plane motion, as illustrated in FIGS. 2b and 3b. However, the same motion limiter principles can be implemented also when a mobile rotor undergoes rotational out-of-plane motion toward the fixed wall, as long as the first attachment section (in the embodiment where the first device part is the mobile rotor) or the connecting section (in the embodiment where the second device part is the mobile rotor) is attached to the side of the rotor which turns upward toward the fixed wall in the rotational motion (not to the side which turns away from it).

In other words, if the rotor would undergo rotational motion, in FIG. 2b the rotor would rotate out of the device plane so that the portion of the rotor where the first attachment section 24 is attached would be brought to the illustrated distance 285 from the fixed wall 271. The motion limiter would then operate as in FIG. 2c and described above. Correspondingly, in FIG. 3b the rotor would rotate out of the device plane so that the portion of the rotor where the connecting section 35 is attached would be brought to the illustrated distance 385 from the fixed wall 371. The motion limiter would then operate as in FIG. 3c.

It is noted that in exemplary aspects, two separate motion limiters can be implemented on opposite sides of the rotor if both of these sides can turn toward the fixed wall in rotational motion.

Multiple Motion Limiters

According to an exemplary aspect, two or more motion limiters can be constructed in the gap between the edge of a rotor and the edge of a stator. Additional motion limiters may be constructed between the opposite edge of the rotor and the edge of another stator which is adjacent to that edge of the rotor. Any disadvantages that may arise from the asymmetric action of a single motion limiter can typically be avoided by placing multiple motion limiters substantially symmetrically around the rotor. The optimal symmetry will depend on the expected out-of-plane movement of the rotor and on other device design considerations.

What is claimed:

1. A microelectromechanical device comprising:
    a mobile rotor that lies in a horizontal device plane in a rest position;
    a fixed stator that lies in the horizontal device plane adjacent to the mobile rotor;
    a fixed wall that defines a wall plane adjacent to the horizontal device plane and that is separated from the mobile rotor in a vertical direction by a rotor-wall gap, with the vertical direction being perpendicular to the horizontal device plane;
    a motion limiter comprising a stopper element;
    a counter-structure that is adjacent to the horizontal device plane and that is separated from the horizontal device plane in the vertical direction, with the counter-structure being separated from the stopper element by a vertical stopper gap when the mobile rotor is in the horizontal device plane,
    wherein, when the mobile rotor undergoes motion in the vertical direction toward the fixed wall, the stopper element contacts the counter-structure across the stopper gap before the mobile rotor contacts the fixed wall across the rotor-wall gap,
    wherein the mobile rotor is one of a first device part and a second device part and the fixed stator is the other of the first device part and the second device part,
    wherein an edge of the first device part is separated from an edge of the second device part in the horizontal device plane by a rotor-stator gap that extends in a transversal direction, and the motion limiter extends from the first device part to the second device part across the rotor-stator gap and comprises a torsionally flexible first attachment section that extends from the edge of the first device part in the transversal direction toward the second device part, and a stopper lever is attached to the attachment section,
    wherein a first side of the stopper lever extends in a first side direction from the attachment section, and a second side of the stopper lever extends in a second side direction from the attachment section, with the second side direction being opposite to the first side direction, and
    wherein the stopper lever comprises the stopper element on the second side, and the motion limiter further comprises a torsionally flexible connecting section that extends from the edge of the second device part to the first side of the stopper lever.

2. The microelectromechanical device according to claim 1, wherein the first attachment section is aligned on a first transversal axis, the stopper element is aligned on a third transversal axis, and an attachment point of the connecting section on the first side of the stopper lever is aligned on a second transversal axis.

3. The microelectromechanical device according to claim 2, wherein a lateral distance from the first transversal axis to the second transversal axis is less than the lateral distance from the first transversal axis to the third transversal axis.

4. The microelectromechanical device according to claim 1, wherein the connecting section extends in the transversal direction from the edge of the second device part to the first side of the stopper lever.

5. The microelectromechanical device according to claim 1, wherein the connecting section comprises a torsionally flexible second attachment section that is attached to the edge of the second device part and extends in the transversal direction toward the first device part.

6. The microelectromechanical device according to claim 5, wherein the connecting section further comprises a torsionally flexible third attachment section that is attached to an attachment point on the first side of the stopper lever.

7. The microelectromechanical device according to claim 6, wherein the connecting section further comprises a connecting lever that extends from the second attachment section to the third attachment section.

8. The microelectromechanical device according to claim 1, wherein the first device part is the mobile rotor, the second device part is the fixed stator, and the fixed wall and the counter-structure are on a same side of the device plane.

9. The microelectromechanical device according to claim 1, wherein the second device part is the mobile rotor, the first device part is the fixed stator, and the fixed wall and the counter-structure are on opposite sides of the device plane.

10. A microelectromechanical device comprising:

a mobile rotor disposed in a horizontal device plane in a resting position;

a fixed stator disposed in the horizontal device plane and adjacent to the mobile rotor;

a fixed wall that defines a wall plane adjacent to the horizontal device plane and that is separated from the mobile rotor by a rotor-wall gap in a vertical direction perpendicular to the horizontal device plane;

a motion limiter comprising a stopper element;

a counter-structure that is separated from the horizontal device plane in the vertical direction and from the stopper element by a vertical stopper gap, wherein, when the mobile rotor undergoes motion in the vertical direction toward the fixed wall, the stopper element contacts the counter-structure across the stopper gap before the mobile rotor contacts the fixed wall across the rotor-wall gap, wherein an edge of the mobile rotor is separated from an edge of the fixed stator in the horizontal device plane by a rotor-stator gap that extends in a transversal direction, and the motion limiter comprises a torsionally flexible first attachment section having a stopper lever attached thereto and that extends from the edge of the mobile rotor in the transversal direction toward the fixed stator, wherein a first side of the stopper lever extends in a first side direction from the first attachment section, and a second side of the stopper lever extends in a second side direction from the first attachment section, with the second side direction being opposite to the first side direction, and wherein the stopper lever comprises the stopper element on the second side, and the motion limiter further comprises a torsionally flexible connecting section that extends from the edge of the fixed stator to the first side of the stopper lever.

11. The microelectromechanical device according to claim 10, wherein the motion limiter extends from the mobile rotor to the fixed stator across the rotor-stator gap.

12. The microelectromechanical device according to claim 10, wherein the first attachment section is aligned on a first transversal axis, the stopper element is aligned on a third transversal axis, and an attachment point of the connecting section on the first side of the stopper lever is aligned on a second transversal axis.

13. The microelectromechanical device according to claim 12, wherein a lateral distance from the first transversal axis to the second transversal axis is less than the lateral distance from the first transversal axis to the third transversal axis.

14. The microelectromechanical device according to claim 11, wherein:

the connecting section comprises a torsionally flexible second attachment section that is attached to the edge of the fixed stator and extends in the transversal direction toward the mobile rotor, the connecting section further comprises a torsionally flexible third attachment section that is attached to an attachment point on the first side of the stopper lever, and the connecting section further comprises a connecting lever that extends from the second attachment section to the third attachment section.

15. A microelectromechanical device comprising:

a mobile rotor disposed in a horizontal device plane in a resting position;

a fixed stator disposed in the horizontal device plane and adjacent to the mobile rotor;

a fixed wall that defines a wall plane adjacent to the horizontal device plane and that is separated from the mobile rotor by a rotor-wall gap in a vertical direction perpendicular to the horizontal device plane;

a motion limiter comprising a stopper element;

a counter-structure that is separated from the horizontal device plane in the vertical direction and from the stopper element by a vertical stopper gap, wherein, when the mobile rotor undergoes motion in the vertical direction toward the fixed wall, the stopper element contacts the counter-structure across the stopper gap before the mobile rotor contacts the fixed wall across the rotor-wall gap, wherein an edge of the fixed stator is separated from an edge of the mobile rotor in the horizontal device plane by a rotor-stator gap that extends in a transversal direction, and the motion limiter comprises a torsionally flexible first attachment section having a stopper lever attached thereto and that extends from the edge of the fixed stator in the transversal direction toward the mobile rotor, wherein a first side of the stopper lever extends in a first side direction from the first attachment section, and a second side of the stopper lever extends in a second side direction from the first attachment section, with the second side direction being opposite to the first side direction, and wherein the stopper lever comprises the stopper element on the second side, and the motion limiter further comprises a torsionally flexible connecting section that extends from the edge of the mobile rotor to the first side of the stopper lever.

16. The microelectromechanical device according to claim 15, wherein the motion limiter extends from the mobile rotor to the fixed stator across the rotor-stator gap.

17. The microelectromechanical device according to claim 15, wherein the first attachment section is aligned on a first transversal axis, the stopper element is aligned on a third transversal axis, and an attachment point of the connecting section on the first side of the stopper lever is aligned on a second transversal axis.

18. The microelectromechanical device according to claim 17, wherein a lateral distance from the first transversal axis to the second transversal axis is less than the lateral distance from the first transversal axis to the third transversal axis.

19. The microelectromechanical device according to claim 16, wherein:

the connecting section comprises a torsionally flexible second attachment section that is attached to the edge of the mobile rotor and extends in the transversal direction toward the fixed stator, the connecting section further comprises a torsionally flexible third attachment section that is attached to an attachment point on the first side of the stopper lever, and the connecting section further comprises a connecting lever that extends from the second attachment section to the third attachment section.

* * * * *